United States Patent
Drozdyk

(10) Patent No.: US 6,558,874 B2
(45) Date of Patent: May 6, 2003

(54) PHOTOSENSITIVE SILVER CONDUCTOR TAPE AND COMPOSITION THEREOF

(75) Inventor: Lorri P. Drozdyk, Hillsborough, NC (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 34 days.

(21) Appl. No.: 10/155,783

(22) Filed: May 24, 2002

(65) Prior Publication Data

US 2002/0182540 A1 Dec. 5, 2002

Related U.S. Application Data

(63) Continuation of application No. 09/210,233, filed on Dec. 11, 1998, now abandoned.

(51) Int. Cl.$^7$ .............................. G03C 1/73; B32B 31/00
(52) U.S. Cl. ............................... 430/281.1; 430/270.1; 430/320
(58) Field of Search .................................. 430/905, 918, 430/913, 281.1, 270.1, 320, 330, 331

(56) References Cited

U.S. PATENT DOCUMENTS

| | | |
|---|---|---|
| 4,724,021 A | 2/1968 | Martin |
| 4,737,446 A | 4/1968 | Cohen et al. |
| 3,958,996 A | 5/1976 | Inskip |
| 4,353,978 A | 10/1982 | Leberzammer et al. |
| 4,465,760 A | 8/1984 | Leyrer et al. |
| 4,517,251 A | 5/1985 | Mosely |
| 4,522,903 A | 6/1985 | Heiart et al. |
| 4,555,473 A | 11/1985 | Dueber et al. |
| 4,613,560 A | 9/1986 | Dueber et al. |
| 4,613,648 A | 9/1986 | Usala |
| 4,528,261 A | 11/1988 | Hauser |
| 4,908,296 A | 3/1990 | Nebe et al. |
| 4,912,019 A | 3/1990 | Nebe et al. |
| 4,925,771 A | 5/1990 | Nebe et al. |
| 4,959,295 A | 9/1990 | Nebe et al. |
| 5,032,490 A | 7/1991 | Nebe et al. |
| 5,047,313 A | 9/1991 | Nebe et al. |
| 5,049,480 A | 9/1991 | Nebe et al. |
| 5,100,764 A | 3/1992 | Paulson et al. |
| 5,393,465 A * | 2/1995 | Drozdyk et al. ............ 252/582 |
| 5,851,732 A | 12/1998 | Kanda et al. |
| 5,874,197 A | 2/1999 | Felten |
| 6,103,452 A | 8/2000 | Kakinuma et al. |
| 6,132,937 A | 10/2000 | Suzuki |
| 6,159,322 A * | 12/2000 | Ogata et al. ................ 156/230 |
| 6,194,124 B1 | 2/2001 | Choi et al. |
| 6,214,527 B1 * | 4/2001 | Kosaka et al. ............. 430/319 |

FOREIGN PATENT DOCUMENTS

| | | |
|---|---|---|
| EP | 0357063 | 6/1989 |
| EP | 0432907 A1 | 11/1990 |
| EP | 0414168 A2 | 2/1991 |
| EP | 0589241 A2 | 9/1993 |
| EP | 0589241 A | 3/1994 |
| JP | 0017714 | 5/1980 |
| JP | 62-100969 | 4/1987 |
| JP | 0215731 A | 8/2000 |

* cited by examiner

Primary Examiner—Janet Baxter
Assistant Examiner—Yvette C. Thornton

(57) ABSTRACT

A composition of a photosensitive silver conductor tape comprising: (1) finely divided inorganic solids comprising (a) finely divided particles of silver solids; (b) finely divided particles of inorganic binder having a glass transition temperature (Tg) of 325–700 ° C., the inorganic solids being dispersed in (2) an organic medium comprising a solution of (c) an organic polymeric binder which is a copolymer, interpolymer or mixture thereof selected from (1) nonacidic comonomers comprising butylmethacrylate or mixtures of butylmethacrylate and $C_{1-10}$ alkyl acrylates, $C_{1-10}$ alkyl methacrylates, styrene, substituted styrenes, or combinations thereof and (2) acidic comonomers comprising ethylenically unsaturated carboxylic acids containing moiety that are at least 15 wt. % of the total polymer weight; and having a Tg of 50–150 ° C. and weight average molecular weight in the range of greater than 55,000 but less than or equal to 300,000; (d) a photoinitiation system; (e) a photohardenable monomer; and with the proviso that the composition is fireable in an oxidizing or substantially nonoxidizing atmosphere at temperature of no higher than 700 ° C.

5 Claims, No Drawings

PHOTOSENSITIVE SILVER CONDUCTOR TAPE AND COMPOSITION THEREOF

This application is a continuation of U.S. Ser. No. 09/210,233 filed Dec. 11, 1998, now abandoned.

FIELD OF THE INVENTION

The present invention is directed to a photosensitive silver conductor tape which exhibits improved development latitude by the selection of a polymer binder containing butyl methacrylate.

BACKGROUND OF THE INVENTION

Since it is the trend in the industry to make smaller and cheaper electronic devices and provide higher resolution for performance, it has become necessary to reduce the size and cost of the conductor layers. However, it has become difficult to create conductor patterns having line widths of less than 100 microns by means of screen printed thick film pastes. Moreover the lithographic precision of the screen becomes poor and errors tend to arise, which makes it difficult to increase pattern density.

Photosensitive materials are one representation of thick film materials commonly applied to a substrate by screen printing, and the organic binder is dissipated by means of a subsequent firing step. However, it is difficult to apply a uniform thickness of a thick film paste by screen printing and the dissipation is often uneven, particularly over large areas. Furthermore, screen printing is a labor intensive process which is expensive. Therefore, the substitution of a tape for a thick film paste is appealing to the industry. Application of a tape to a substrate by hot roll lamination is very cost effective because it provides high throughput and results in high, reliable circuit yields.

Development latitude, wherein the range in the time involved in forming an acceptable latent image during an exposure is developed in a dilute aqueous base solution and is washed off, is a key performance characteristic in utilizing tapes in the construction of a circuit. It is beneficial to the manufacturer that a tape has properties which provides a range in development times resulting in acceptable resolution with little variation in fired line width and thickness. The industry has been lacking tapes with improved development latitude. Therefore, the need exists for a photosensitive silver tape with improved development latitude.

SUMMARY OF THE INVENTION

The present invention relates to a composition of a photosensitive silver conductor tape comprising: (1) finely divided inorganic solids comprising (a) finely divided particles of silver solids; (b) finely divided particles of inorganic binder having a glass transition temperature (Tg) of 325–700° C., the inorganic solids being dispersed in (2) an organic medium comprising a solution of (c) an organic polymeric binder which is a copolymer, interpolymer or mixture thereof selected from (1) nonacidic comonomers comprising butylmethacrylate or mixtures of butylmethacrylate and $C_{1-10}$ alkyl acrylates, $C_{1-10}$ alkyl methacrylates, styrene, substituted styrenes, or combinations thereof and (2) acidic comonomers comprising ethylenically unsaturated carboxylic acids containing moiety that are at least 15wt. % of the total polymer weight; and having a Tg of 50–150° C. and weight average molecular weight in the range of greater than 55,000 but less than or equal to 300,000; (d) a photoinitiation system; (e) a photohardenable monomer; and with the proviso that the composition is fireable in an oxidizing or substantially nonoxidizing atmosphere at temperature of no higher than 7000° C.

The invention is also directed to a method for forming an electrode arrangement for a plasma display panel device comprising the steps of: (a) forming a tape with the photosensitive silver composition of the above; (b) applying the tape to a substrate; (c) imagewise exposing the film to actinic radiation to define the specified pattern; (d) developing the exposed composition in an aqueous solution to remove the composition in area not exposed to actinic radiation; and (e) firing the developed conductive composition.

DETAILED DESCRIPTION OF THE INVENTION

The present invention is a photosensitive silver conductor tape which exhibits improved development latitude by the selection of a polymer binder containing butyl methacrylate. Components, formation and processing of the photosensitive silver conductor tape are discussed below.

A. Conductive Component

Virtually any shape silver particle in powder form, including spherical particles and flake (rods, cones, plates) may be used in practicing the invention. It is preferred that the particles be in the range of 0.2 μm and 20 μm. It has been found that the dispersion of the invention must contain no significant amount of solids having a particle size of less than 0.2 μm. When particles of this small size are present it is difficult to adequately obtain complete burnout of the organic medium when the films or layers thereof are fired to dissipate the organic medium and to effect sintering of the inorganic binder and the silver solids. In using the dispersion to make dry photosensitive tape, the maximum particle size must not exceed the desired thickness of the tape. It is preferred that at least 80 percent by weight of the silver solids fall within the 0.5–10 μm range.

In addition, it is preferred that the surface area/weight ratio of the silver particles not exceed 20 $m^2$/g. When silver particles having a surface area/weight ratio greater than 20 $m^2$/g are used, the sintering characteristics of the accompanying inorganic binder are adversely affected. It is difficult to obtain adequate burnout and blisters may appear.

It is known that small amounts of other metals, such as: Au, Pd, Pt and Cu or mixtures thereof, may be added to silver conductor compositions to improve the properties of the conductor. Generally the metal particles are spherical -in shape, preferably approximately 0.1 to 10 microns in diameter. When present, the other metal powders comprise from about 0.05 to 5.0 percent by weight of the total tape composition, and preferably from about 0.1 to about 2.0 percent.

Often, copper oxide is added to improve adhesion. The copper oxide should be present in the form of finely divided particles, preferably ranging in size from about 0.5 to 5 microns. When present as $Cu_2O$, the copper oxide comprises from about 0.1 to about 3 percent by weight of the total composition, and preferably from about 0.1 to 1.0 percent. Part or all of the $Cu_2O$ may be replaced by molar equivalents of CuO.

B. Inorganic Binders

The inorganic binders, which can also be referred to as glasses or frits, used in this invention help sinter the conductive component particles and can be any composition known in the art providing it has a softening point below the melting point of the conductive components. The softening point of the inorganic binder has considerable influence on the sintering temperature. For the conductive composition of the present invention to be sufficiently sintered on an underlying layer, the glass transition temperature (Tg) is about 325–700° C., preferably about 350–650° C. and more preferably about 375–600° C.

If significant melting takes place below 325° C., organic material will likely be encapsulated and blisters will tend to form in the composition as the organic materials decompose. On the other hand, a Tg above 700° C. will tend to produce a composition with poor adhesion.

The glass frit most preferably used are the borosilicate frits, such as lead borosilicate frit, bismuth, cadmium, barium, calcium or other alkaline earth borosilicate frits. The preparation of such glass frits is well known in the art and consists, for example, of melting together the constituents of the glass in the form of the oxides of the constituents and pouring such molten composition into water to form the frit. The batch ingredients may, of course, be any compound that will yield the desired oxides under the usual conditions of frit production. For example, boric oxide will be obtained from boric acid, silicon dioxide will be produced from flint, barium oxide will be produced from barium carbonate, etc.

The frit is passed through a fine mesh screen to remove large particles since the solid composition should be agglomerate free. The inorganic binder has a preferred surface to weight ratio of no more than 10 m$^2$/g. Preferably at least 90 percent by weight of the particles have a preferred particle size of 0.4–10 μm.

The inorganic binder is preferably 0.01–25 percent by weight of the weight of the conductive particles. At higher levels of inorganic binder, the bondability to the substrate is reduced.

C. Organic Polymer Binders

The polymer binder is important to the tape compositions of this invention. They must take into consideration the aqueous-developability and must give a high resolving power. It was found that these requirements were satisfied by selecting the following binders. That is, these binders are copolymers or interpolymers made from (1) nonacidic comonomers comprising butylmethacrylate or mixtures of butylmethacrylate and $C_{1-10}$ alkyl acrylates, $C_{1-10}$ alkyl methacrylates, styrene, substituted styrenes, or combinations thereof and (2) acidic comonomers comprising ethylenically unsaturated carboxylic acids containing moiety that are at least 15 wt. % of the total polymer weight; and having a Tg of 50–150° C. and weight average molecular weight greater than 50,000 but less than and including 300,000. The butyl methacrylate should be present in the polymer in the range of 5–50 weight %.

The presence of acidic comonomer components in the composition is important in this technique. The acidic functional group generates the ability to be developed in aqueous bases such as aqueous solutions of 0.4–2.0% sodium carbonate. When acidic comonomers are present in concentrations of less than 15%, the composition is not washed off completely with an aqueous base. When the acidic comonomers are present at concentrations greater than 30%, the composition is less stable under development conditions and partial development occurs in the image portions. Appropriate acidic comonomers include ethylenically unsaturated monocarboxylic acids such as acrylic acid, methacrylic acid, or crotonic acid and ethylenically unsaturated dicarboxylic acids such as fumaric acid, itaconic acid, citraconic acid, vinyl succinic acid, and maleic acid, as well as their hemiesters, and in some cases their anhydrides and their mixtures. Because they are cleaner burning in low-oxygen atmospheres, methacrylic polymers are preferred over acrylic polymers.

When the nonacidic comonomers are alkyl acrylates or alkyl methacrylates as mentioned above, it is preferable that these nonacidic comonomers constitute at least 50 wt. %, preferably 70–75 wt. %, of the polymer binder. When the nonacidic comonomers are styrene or substituted sytrenes, it is preferable that these nonacidic comonomers constitute 50 wt. % of the polymer binder and that the other 50 wt. % is an acid anhydride such as the hemiester of maleic anhydride. A favorable substituted styrene is alpha-methylstyrene.

Although not preferable, the nonacidic portion of the polymer binder can contain up to about 50 wt. % of other nonacidic comonomers as substitutes for the alkyl acrylate, alkyl methacrylate, styrene, or substituted styrene portions of the polymer. Examples include: acrylonitrile, vinyl acetate, acrylamide. However, because it is more difficult for these to completely burn out, it is preferable that less than about 25 wt. % of such monomers in the total polymer binder are used. The use of single copolymers or combinations of copolymers as binders are recognized as long as each of these satisfies the various standards above. In addition to the above copolymers, adding small amounts of other polymer binders is possible. For examples of these, polyolefins such as polyethylene, polypropylene, polybutylene, polyisobutylene, and ethylene-propylene copolymers, as well as polyethers that are low alkylene oxide polymers such as polyethylene oxide, can be cited.

An important performance characteristic for the invention is development latitude, or the ability to appropriately develop or wash off desired areas of the tape composition using a range of development times, which are affected by the polymer characteristics chosen. It is believed that the use of butylmethacrylate or mixtures of butylmethacrylate and $C_{1-10}$ alkyl acrylates, $C_{1-10}$ alkyl methacrylates, styrene, substituted styrenes, or combinations thereof increase the hydrophobic nature of the nonacidic comonomer components of the polymer which, in turn, increases the development latitude. This also, can be accomplished including groups such as cyclohexyl or benzyl. In addition, a lower acid number for the polymer, or decreasing the proportion of the acidic component can increase the development latitude. For example, a preferred acid number range is 100–165, and more preferred is 110–150.

The polymers described herein can be produced by those skilled in the art of acrylate polymerization by commonly used solution polymerization techniques.

Typically, such acidic acrylate polymers are produced by mixing α- or β-ethylenically unsaturated acids (acidic comonomers) with one or more copolymerizable vinyl monomer (nonacidic comonomers) in a relatively low-boiling-point (75–150° C.) organic solvent to obtain a 10–60% monomer mixture solution, then polymerizing the monomers by adding a polymerization catalyst and heating the mixture under normal pressure to the reflux temperature of the solvent. After the polymerization reaction is essentially complete, the acidic polymer solution produced is cooled to room temperature, samples are collected, and the polymer viscosity, molecular weight, and acid equivalents are measured.

Furthermore, it is necessary to keep the molecular weight of the acid-containing polymer binder greater than 50,000 and less than or equal to 300,000, and preferably 55,000–300,000 and more preferably 55,000–150,000 and still more preferably 60,000–150,000.

When the above composition is coated to form a dry film, it is preferable that the Tg (glass transition temperature) of the polymer binder is 50–150° C., and more preferably 50–100° C.

D. Photoinitiators

Suitable photoinitiators are those that are thermally inactive but generate free radicals when exposed to actinic radiation at 185° C. or less. These include substituted or unsubstituted multinucleate quinones that are compounds having 2 intramolecular rings in a conjugated carbon ring system and include, for example, 9,10-anthraquinone, 2-methyl anthraquinone, 2-ethyl anthraquinone, 2-tert-butyl anthraquinone octamethyl anthraquinone, 1,4-naphthoquinone, 9,10-phenanthrene quinone, benz(a) anthracene-7, 12-dione, 2,3-naphthacen-5,12, dione, 2-methyl-1,4-naphthoquinone, 1,4-dimethyl anthraquinone, 2,3-dimethyl anthraquinone, 2-phenyl anthraquinone, 2,3-diphenyl anthraquinone, retenequinone, 7,8,9,10-tetrahydronapthacene-5,12-dione, and 1,2,3,4-tetrahydrobenz(a) anthracene-7,12-dione. Other photoinitiators that are useful are described in U.S. Pat. No. 2,760,863, although some are thermally active even at low temperatures such as 85° C. and include adjacent (viscinal) ketaldonyl alcohols, for example, benzoin or pivaloin; acyloin ethers, for example, benzoin methyl and ethyl ethers; hydrocarbon-substituted aromatic acyloins, including α-methyl benzoin, α-allyl benzoin, α-phenyl benzoin, thioxthone and thioxthone derivatives and hydrogen donors.

Photoreducing dyes and reducing agents, those presented in U.S. Pat. Nos. 2,850,445, 2,875,047, 3,097,096, 3,074,974, 3,097,097, and 3,145,104 as well as phenazine, oxazine, and quinone classes Michler's ketone, ethyl Michler's ketone, benzophenone, 2,4,5-triphenyl imidazolyl dimers with hydrogen-donators including leuco dyes and their mixtures (described in U.S. Pat. Nos. 3,427,161, 3,479, 185, and 3,549,367), can be used as initiators. Also, the sensitizers presented in U.S. Pat. No. 4,162,162 are useful with photoinitiators and photoinhibitors. The photoinitiators or photoinitiator system is present in an amount of 0.05 to 10% by weight based on the total weight of the dry photopolymerizable layer.

E. Photohardenable Monomer

The photohardenable monomers component of this invention is comprised of at least one addition polymerizable ethylenically unsaturated compound having at least one polymerizable ethylene group.

Such compounds are capable of forming polymers by being initiated by free radicals and undergoing chain-propagating addition polymerization. The monomer compounds are nongaseous, that is, having boiling points greater than 100° C., and have plasticizing effects on the organic polymer binders.

Preferred monomers that can be used alone or used as combinations with other monomers include t-butyl acrylate and methacrylate, 1,5-pentanediol diacrylate and dimethyacrylate, N,N-dimethylaminoethyl acrylate and methacrylate, ethylene glycol diacrylate and dimethacrylate, 1,4-butanediol diacrylate and dimethacrylate, diethylene glycol diacrylate and dimethacrylate, hexamethylene glycol diacrylate and dimethacrylate, 1,3-propanediol diacrylate and dimethacrylate, decamethylene glycol diacrylate and dimethacrylate, 1,4-cyclohexanediol diacrylate, and dimethacrylate, 2,2-dimethylolpropane diacrylate and dimethacrylate, glycerol diacrylate and dimethacrylate, tripropylene glycol diacrylate and dimethacrylate, glycerol triacrylate and trimethacrylate, trimethylolpropane triacrylate and trimethacrylate, and compounds like those presented in U.S. Pat. No. 3,380,381, 2,2-di(p-hydroxyphenyl)-propane diacrylate, pentaerythritol tetraacrylate and tetramethacrylate, 2,2-di(p-hydroxyphenyl)-propane tetramethacrylate, 2,2-di(p-hydroxyphenyl)-propane dimethacrylate, triethylene glycol diacrylate, polyoxyethyl-1,2-di-(p-hydroxyethyl) propane dimethacrylate, bisphenol-A di-(3-methacryloxy-2-hydroxypropyl) ester, bisphenol-A di(3-acryloxy-2-hydroxypropyl) ether, bisphenol-A di(2-methacryloxyethyl) ether, bisphenol-A di(2-acryloxyethyl) ether, 1,4-butanediol di-(3-methacryloxy-2-hydroxypropyl) ether, triethylene glycol dimethacrylate, polyoxypropyl trimethylolpropane triacrylate, butylene glycol diacrylate and dimethacrylate, 1,2,4-butanediol triacrylate and trimethacrylate, 2,2,4-trimethyl-1,3-pentanediol diacrylate and dimethacrylate, 1-phenylethylene-1,2-dimethacrylate, diallyl fumarate, styrene, 1,4-benzenediol dimethacrylate, 1,4-diisopropenyl benzene, and 1,3,5-triisopropenylbenzene.

Ethylenically unsaturated compounds having molecular weights of at least 300, for example, alkylene or polyalkylene glycol diacrylates produced from alkylene glycols or polyalkylene glycols with 1-10 ether bonds of 2-1 5-carbon alkylene glycols and those presented in U.S. Pat. No. 2,927,022, for example, those having several addition-polymerizable ethylene bonds, particularly when they exist as terminal bonds, are also useful.

Other useful monomers are disclosed in U.S. Pat. No. 5,032,490.

Preferred monomers are polyoxyethylated trimethylolpropane triacrylate and methacrylate, ethylated pentaerythritol triacrylate, trimethylolpropane triacrylate and methacrylate, dipentaerythritol monohydroxyphentaacrylate, and 1,10-decanediol dimethacrylate.

Other favorable monomers are monohydroxypolycaprolactone monoacrylate, polyethylene glycol diacrylate (molecular weight of about 200), and polyethylene glycol 400 dimethacrylate (molecular weight of about 400). Unsaturated monomer components are present in amounts of 1–20 wt %, based on the total weight of the dry photopolymerizable layer.

F. Organic Solvent

One purpose of the organic medium is to serve as a vehicle for the dispersion of the finely divided solids of the composition in such form that it can readily be applied to a substrate. Thus, the organic medium must first be one in which the solids are dispersible with an adequate degree of stability. Secondly, the Theological properties of the organic medium must be such that they lend good application properties to the dispersion.

The solvent component of the organic medium, which may be a mixture of solvents, is chosen so as to obtain complete solution therein of the polymer and other organic components. The solvent should be inert (non-reactive) towards the other constituents of the composition. The solvent(s) should have sufficiently high volatility to enable the solvent to be evaporated from the dispersion by the application of relatively low levels of heat at atmospheric pressure. In addition, the solvent must boil well below the boiling point and decomposition temperature of any other additives contained in the organic medium. Thus, solvents having atmospheric boiling points below 150° C. are used most frequently. Such solvents include benzene, acetone, xylene, methanol, ethanol, methylethyl ketone, 1,1,1-trichloroethane, tetrachloroethylene, amyl acetate, 2,2,4-triethyl pentanediol-1,3-monoisobutyrate, toluene, methylene chloride, and ethylene glycol monoalkyl and dialkyl ethers such as ethylene glycol mono-n-propyl ether and ethyl acetate. For casting films, ethyl acetate is particularly preferred.

G. Additional Components

Additional components known in the art may be present in the composition including dispersants, stabilizers, plasticizers, release agents, dispersing agents, stripping agents, antifoaming agents, and wetting agents. A general disclosure of suitable materials is presented in U.S. Pat. No. 5,032,490.

It is sometimes desired to add a stabilizer to the silver conductor compositions of the invention. This is particularly preferred when frit is present in the silver conductor composition. Without the stabilizer the frit reacts with the acid functionality in the polymer binder resulting in the crosslinking of the formulation and increase in the compositions viscosity and potential formation to an intractable hard mass. Any compound may be used which prevents such crosslinking without adversely affecting the other properties of the photosensitive conductor composition, either before or after firing. This may be accomplished by complexation with the frit, by salt formation with the acid functionality, or other reactions. Preferred stabilizers include carboxybenzotriazole and malonic acid.

H. Tape Formation

Since a tape is usually cast from slip (photopolymerizable composition), the recipe is generally based on total composition: inorganic phase 45–75 weight %, non-volatile organic phase 8–22 weight %, and volatile solvent 10–40 weight %. The aforementioned values of the slip are guidelines that include the more likely range of inorganic solids, organic solids and solvents that are apt to be encountered in actual formulations. The slip is cast into tape by conventional tape casting techniques generally known in the industry. More particularly, the photopolymerizable composition is coated upon a support film and the solvent is volatilized by heating; resulting in a dry coating thickness of about 0.0001 inch (0.0025 cm) to about 0.01 inch (0.025 cm) or more. A suitable strippable support which preferably has a high degree of dimensional stability to temperature changes may be chosen from a wide variety of films composed of high polymers, e.g., polyamides, polyolefins, polyesters, vinyl polymers, and cellulose esters and may have a thickness of from 0.0005 inch (0.0013 cm) to 0.008 inch (0.02 cm) or more. If exposure is to be made before removing a strippable support, it must, of course, transmit a substantial fraction of the actinic radiation incident upon it. If the strippable support is removed prior to exposure, no such restrictions apply. A particularly suitable support is transparent MYLAR® film having a thickness of about 0.001 inch (.025 cm).

When an element contains no removable, protective cover sheet and is to be stored in roll form, the reverse side of the strippable support preferably has applied thereto a thin release layer of a material such as wax or silicone to prevent it from sticking to the photopolymerizable material. Alternatively, adhesion to the coated photopolymerizable layer may be preferentially increased by flame treating or electrical discharge treating the support surface to be coated.

Suitable removable, protective cover sheets when used may be chosen from the same group of high polymer films described above and may have the same wide range of thicknesses. A cover sheet of 0.001 inch (0.025 cm) thick MYLAR® is especially suitable. Supports and cover sheets as described above provide good protection to the photopolymerizable layer during storage prior to use.

I. Processing

The photosensitive silver conductor tapes are conventionally applied to a substrate by hot roll lamination. Thereafter the silver conductor tape is imagewise exposed to actinic radiation to define areas which have been exposed. Development is achieved by removal of the unexposed areas of the layer. For aqueous development the tape will be removed in portions which are not exposed to radiation but exposed portions will be substantially unaffected by using a liquid such as wholly aqueous solutions containing 0.4–2.0% sodium carbonate by weight. In the present disclosure, it is understood that in actual use, development need not be with 0.8% by weight sodium carbonate solutions—e.g., aqueous solutions of other alkalies may be employed. However, the tapes of the present invention have the capability of development in such carbonate solutions. Generally development takes place within 5 to 120 seconds.

Other processing steps, which may be conventional, can take place before a firing operation takes place. Firing is done to sinter the inorganic binder and silver solids. Firing takes place in an oxidizing or a substantially nonoxidizing atmosphere at a temperature no higher than 700° C. The preferred oxidizing atmosphere is air. By the term "substantially nonoxidizing atmosphere" is meant an atmosphere which contains sufficient oxygen to effect oxidation of the organic material. In practice, it has been found that a nitrogen atmosphere of 10–500 ppm $O_2$ can be used for firing the conductor compositions of the invention.

The present invention will be described in further detail by giving practical examples. The scope of the present invention, however, is not limited in any way by these practical examples.

EXAMPLES

The composition for Example 1 was prepared by producing a slip and tape casting to produce a dried film. A mixture of organic materials (TAOBN, Ethyl 4-dimethylaminobenzoate, 2,2 dimethoxy-2-phenyl-acetopheone, Isopropyl thioxanthone, Acrylic copolymer A was prepared in the ratio given in Table 1 by dissolving in solvent (ethyl acetate). Table 2 describes formulations of Acrylic copolymer A and Acrylic copolymer B as listed in Table 1. A paste containing 81.8 weight % frit dispersed in 18.2 weight % Ethoxylated Trimethylolpropane Triacrylate Ester was prepared by roll milling in order to disperse the frit in the liquid. The slip was prepared by combining the organic mixture, dispersed frit past, silver powder, carboxybenzotriazole, and balance of the Ethoxylated Trimethylolpropane Triacrylic Ester, and mixing by high speed dispersion to disperse the silver powder in the other ingredients. The slip viscosity was reduced with additional solvent, and an 11 um thick tape was produced by tape casting the slip.

The composition for Example 2 was prepared by producing a thick film paste. A mixture of organic materials (Vinyl pyrrolidone/vinyl acetate copolymer, TAOBN, Ethyl 4-dimethylarninobenzoate, 2,2-dimethoxy-2-phenyl acetopheone, Isopropyl thioxathone, Acrylic copolymer B was prepared in the ratio given in Table 1 by dissolving in solvent (texanol). The paste was prepared by combining the organic mixture, frit, silver powder, Carboxy cabratec, Ethoxylated Trimethylolpropane Triacrylate, Carboxybenzotriazole and additional solvent, and mixing followed by roll milling to disperse the silver powder and frit in the other ingredients.

The compositions of Examples 1 and 2 were evaluated by applying the tape or paste to a glass substrate. Tape in Example 1 was applied to a glass substrate by hot roll lamination at 800° C. (thickness after lamination =10.9 um). Paste in Example 2 was applied to a glass substrate by screen printing and drying at 80° C. (thickness after printing and drying =11.9 um). Samples were exposed to light using an Oriel Corporation exposure unit operated at 15 mW/cm² for either 9 seconds or 27 seconds. After heat treatment at 120° C. for 10 minutes, the samples were developed for various durations using a DuPont RISTON® C 2-Processor developer with a 1% $Na_2CO_3$ H20 solution. Areas on the samples which were exposed to sufficient light remained on the substrate, whereas unexposed areas washed off the substrate during development. The time to clear (TTC) was determined for each of the two materials by measuring the development time to remove all material from three non-exposed samples. Development times selected were based on the TTC for the samples and were multiples of the TTC for a particular material (1.5, 2.0, 3.0, 4.0×TTC). Samples were evaluated for finest line resolution by determination of the smallest line width to meet the criteria of (1) all lines adhered to the substrate without removal during development and (2) all material between the lines was removed leaving well defined lines. An additional characteristic necessary for a quality photoimaged pattern is the absence of residual material from unexposed areas after development (indicated in Table 3 as "Res."). Samples were fired at 600° C. for 10 minutes using a 3 hour profile, followed by measurement of line width using an optical microscope and line thickness using a surface profilometer.

Criteria for acceptable resolution was based on finest line resolution of ≦40 um, without significant residual material remaining on the substrate. The development latitude for each material and exposure combination is expressed in Table 3 as the variation in development times which result in acceptable resolution. It is important to achieve little variation (<10% from the average) in fired line width and thickness for assessment of development latitude. Table 3 gives the average line width and average fired thickness for samples with finest line resolution <40 um and absence of residual material, along with the variation in fired line width and fired thickness from these averages. Samples having development times within the development latitude range of acceptable resolution had fired line widths and thicknesses <10% from the average, whereas samples having development times outside the development latitude range of acceptable resolution generally had fired line widths and thicknesses >10% from the average.

Consideration of the important quality requirements (line resolution, absence of residual material, and little variation in fired line width and thickness) in the assessment of development latitude for the examples concludes that Example 1 material containing acrylic copolymer A provides a much greater development latitude (7.4–14.8 seconds) than Example 2 material containing acrylic copolymer B (13.3 seconds), and with no degradation to line resistance for Example 1.

TABLE 1

| Example 1 | Example 2 | |
|---|---|---|
| 77.64 | 77.24 | Silver powder |
| 1.64 | 1.63 | Frit Bi2O3—PbO—B2O3—SiO2 |
| 0.18 | 0.18 | carboxybenzotriazole |
| 5.45 | 5.43 | Ethoxylated Trimethylolpropane Triacrylate |
| 0.02 | 0.02 | TAOBN |
| 0.0 | 0.53 | Vinylpyrrolidone/vinyl acetate copolymer |
| 0.76 | 0.75 | Ethyl 4-dimethylaminobenzoate |
| 0.90 | 0.89 | 2,2-dimethoxy-2-phenyl-acetopheone |
| 0.76 | 0.75 | Isopropyl thioxanthone |
| 12.65 | — | Acrylic copolymer A |
| — | 12.58 | Acrylic copolymer B |

TABLE 1-continued

| Example 1 | Example 2 |
|---|---|
| 100.00 | 100.00 |

TABLE 2

| | Acrylic Copolymer A | Acrylic Copolymer B |
|---|---|---|
| Composition | | |
| Methylacrylic Acid | 21 | 25 |
| Methyl methacrylate | 35 | 75 |
| Ethylmethacrylate | 19 | |
| Butyl methacrylate | 25 | |
| Acid Number | 130 | 157 |
| Product Number (B. F. Goodrich) | Carboset XPD2264 | Carboset XPD1234 |

TABLE 3

| | Fodel* Ag Example 1 | | Fodel* Ag Example 2 | |
|---|---|---|---|---|
| Line Resistance, mOhm/sq. (normalized to 6 um fired thickness) | 4.4 | | 4.9 | |
| Time to Clear (TTC), sec. | 7.4 | | 6.6 | |
| | Expose 9 sec. | Expose 27 sec | Expose 9 sec | Expose 27 sec |
| Development Time, sec | | | | |
| 1.5 × TTC | 11.1 | 11.1 | 9.9 | 9.9 |
| 2.0 × TTC | 14.8 | 14.8 | 13.2 | 13.2 |
| 3.0 × TTC | 22.2 | 22.2 | 19.8 | 19.8 |
| 4.0 × TTC | 29.6 | 29.6 | 26.4 | 26.4 |
| Finest Line Resolution | | | | |
| 1.5 × TTC | 50, Res. | 60, Res. | 30 | 40, Res |
| 2.0 × TTC | 40 | 50, Res. | 30 | 40, Res |
| 3.0 × TTC | 40 | 30 | >50 | 40 |
| 4.0 × TTC | 40 | 40 | >80 | 50 |
| Variation in Development Time for ≦40 um Resolution, sec. (Development Latitude) | 4.8–29.6 | 22.2–29.6 | 9.9–13.2 | 19.8 |
| Range in Development Time for ≦40 um Resolution, sec. (Development Latitude) | 14.8 | 7.4 | 13.3 | 0 |
| Fired Line Width, um | | | | |
| Average* Width | 56.3 | 58.0 | 57.5 | 55.0 |
| 1.5 × TTC | 66 | 73 | 58 | 63 |
| 2.0 × TTC | 60 | 60 | 57 | 60 |
| 3.0 × TTC | 55 | 58 | 50 | 55 |
| 4.0 × TTC | 54 | 58 | — | 53 |
| Fired Line Width Variation from Average*, % | | | | |
| 1.5 × TTC | 17.2 | 25.9 | 0.9 | 14.6 |
| 2.0 × TTC | 6.6 | 3.5 | 0.9 | 9.1 |
| 3.0 × TTC | 2.3 | 0.0 | 13.0 | 0.0 |
| 4.0 × TTC | 4.1 | 0.0 | — | 3.6 |
| Fired Thickness, um | | | | |
| Average Thickness* | 5.6 | 5.8 | 6.5 | 8.4 |
| 1.5 × TTC | 4.9 | 5.0 | 6.4 | 6.4 |
| 2.0 × TTC | 5.3 | 5.3 | 6.6 | 6.6 |
| 3.0 × TTC | 5.9 | 5.9 | 8.9 | 8.4 |
| 4.0 × TTC | 5.7 | 5.7 | 8.6 | 10.2 |
| Fired Thickness Variation from Average*, % | | | | |

TABLE 3-continued

| | | | | |
|---|---|---|---|---|
| 1.5 × TTC | 13.0 | 13.8 | 1.5 | 23.8 |
| 2.0 × TTC | 5.9 | 8.6 | 1.5 | 21.4 |
| 3.0 × TTC | 4.8 | 1.7 | 36.9 | 0.0 |
| 4.0 × TTC | 1.2 | 1.7 | 32.3 | 21.4 |

*Average of samples with finest line resolution ≦40 um, and absence of residual material.

What is claimed is:

1. A photosensitive conductor composition which is coated on a support film comprising
   1) finely divided inorganic solids comprising
      (a) finely divided particles of silver solids;
      (b) finely divided particles of inorganic binder having a glass transition temperature (Tg) of 325–700° C., the inorganic solids being dispersed in
   2) an organic medium comprising a solution of
      (c) an organic polymeric binder which is a copolymer, interpolymer or mixture thereof selected from (1) nonacidic comonomers comprising butylmethacrylate or mixtures of butylmethacrylate and $C_{1-10}$ alkyl acrylates, $C_{1-10}$ alkyl methacrylates, styrene, substituted styrenes, or combinations thereof and (2) acidic comonomers comprising ethylenically unsaturated carboxylic acids containing moiety that are at least 15 wt. % of the total polymer weight; and having a Tg of 50–150° C. and weight average molecular weight in the range of greater than 55,000, but less than or equal to 300,000;
      (d) a photoinitiation system;
      (e) a photohardenable monomer; and
   with the proviso that the composition is fireable in an oxidizing or substantially nonoxidizing atmosphere at temperature of no higher than 700° C.

2. The composition of claim 1 wherein the organic medium further comprises.organic solvent.

3. The composition of claim 2 cast on a strippable support wherein the organic solvent is volatilized forming a tape.

4. The tape of claim 3 further comprising a cover sheet.

5. A method for forming an electrode arrangement for a plasma display panel device comprising the steps of:
   (a) applying the tape of claim 3 to a substrate;
   (b) imagewise exposing the film to actinic radiation to define the specified pattern;
   (c) developing the exposed composition in an aqueous solution to remove the composition in area not exposed to actinic radiation; and
   (d) firing the developed conductive composition.

* * * * *

UNITED STATES PATENT AND TRADEMARK OFFICE
CERTIFICATE OF CORRECTION

PATENT NO. : 6,558,874 B2
DATED : May 6, 2003
INVENTOR(S) : Drozdyk Lorri P.

It is certified that error appears in the above-identified patent and that said Letters Patent is hereby corrected as shown below:

<u>Title page,</u>
Item [56], References Cited, U.S. PATENT DOCUMENTS, should include:
-- 5,972,564    10/26/1999    Kawana et al...............430/281.1

Signed and Sealed this

Seventh Day of September, 2004

JON W. DUDAS
*Director of the United States Patent and Trademark Office*